(12) United States Patent
Hsu

(10) Patent No.: US 11,335,733 B2
(45) Date of Patent: May 17, 2022

(54) ORGANIC LIGHT EMITTING DIODE DISPLAY PANEL, METHOD FOR MANUFACTURING THE SAME AND DISPLAY DEVICE

(71) Applicants: Hefei Xinsheng Optoelectronics Technology Co., Ltd., Anhui (CN); BOE Technology Group Co., Ltd., Beijing (CN)

(72) Inventor: Minghung Hsu, Beijing (CN)

(73) Assignees: Hefei Xinsheng Optoelectronics Technology Co.. Ltd., Anhui (CN); BOE Technology Group Co., Ltd., Beijing (CN)

(*) Notice: Subject to any disclaimer, the term of this patent is extended or adjusted under 35 U.S.C. 154(b) by 121 days.

(21) Appl. No.: 16/649,654

(22) PCT Filed: Jun. 11, 2019

(86) PCT No.: PCT/CN2019/090691
§ 371 (c)(1),
(2) Date: Mar. 22, 2020

(87) PCT Pub. No.: WO2019/238038
PCT Pub. Date: Dec. 19, 2019

(65) Prior Publication Data
US 2020/0303470 A1    Sep. 24, 2020

(30) Foreign Application Priority Data
Jun. 14, 2018   (CN) .......................... 201810613155.0

(51) Int. Cl.
*H01L 27/32* (2006.01)
*H01L 27/12* (2006.01)
(Continued)

(52) U.S. Cl.
CPC ...... *H01L 27/3209* (2013.01); *H01L 27/1218* (2013.01); *H01L 51/0004* (2013.01);
(Continued)

(58) Field of Classification Search
CPC .............. H01L 25/048; H01L 27/3209; H01L 27/3267
See application file for complete search history.

(56) References Cited

U.S. PATENT DOCUMENTS

2006/0138418 A1    6/2006 Lee et al.
2010/0176719 A1*   7/2010 Hirakata ............... H01L 25/048
                                                  313/504
(Continued)

FOREIGN PATENT DOCUMENTS

CN        1779974 A    5/2006
CN      102707481 A   10/2012
(Continued)

OTHER PUBLICATIONS

First Office Action and English language translation, CN Application No. 201810613155.0, dated Apr. 3, 2020, 15 pp.

*Primary Examiner* — Daniel P Shook
(74) *Attorney, Agent, or Firm* — Myers Bigel, P.A.

(57) ABSTRACT

An organic light emitting diode display panel is provided, including a first substrate, a second substrate opposite to the first substrate, at least one first light emitting layer on a side of the first substrate facing the second substrate, at least one second light emitting layer on the side of the first substrate facing the second substrate, the at least one second light emitting layer being separated from the at least one first light emitting layer, and at least two third light emitting layers on a side of the second substrate facing the first substrate. The at least one first light emitting layer and the at least one second light emitting layer are aligned with corresponding ones of the at least two third light emitting layers.

20 Claims, 3 Drawing Sheets

(51) Int. Cl.
   *H01L 51/00*   (2006.01)
   *H01L 51/50*   (2006.01)
   *H01L 51/52*   (2006.01)
   *H01L 25/04*       (2014.01)

(52) U.S. Cl.
   CPC ...... *H01L 51/5064* (2013.01); *H01L 51/5218* (2013.01); *H01L 51/5234* (2013.01); *H01L 25/048* (2013.01)

(56) References Cited

U.S. PATENT DOCUMENTS

| | | |
|---|---|---|
| 2013/0335646 A1 | 12/2013 | Liao et al. |
| 2016/0133840 A1 | 5/2016 | Song et al. |
| 2017/0317152 A1 | 11/2017 | Hsu |

FOREIGN PATENT DOCUMENTS

| | | |
|---|---|---|
| CN | 102778777 A | 11/2012 |
| CN | 105140247 A | 12/2015 |
| CN | 106842731 A | 6/2017 |
| CN | 108511508 A | 9/2018 |

\* cited by examiner

ORGANIC LIGHT EMITTING DIODE DISPLAY PANEL, METHOD FOR MANUFACTURING THE SAME AND DISPLAY DEVICE

CROSS REFERENCE TO RELATED APPLICATIONS

The present application is a 35 U.S.C. 371 national stage application of PCT International Application No. PCT/CN2019/090691, filed on Jun. 11, 2019, which claims the benefit of Chinese Patent Application No. 201810613155.0, filed on Jun. 14, 2018, the entire disclosures of which are incorporated herein by reference.

TECHNICAL FIELD

This disclosure generally relates to the field of display panels, and in particular to an organic light emitting diode (OLED) display panel, a method for manufacturing the same and a display device.

BACKGROUND

Organic light emitting diodes have advantages such as self-luminescence, easy for large area preparation and full-color display, and are especially suitable for being used in a large-sized display device. However, with increasingly higher resolution, the aperture ratio of OLED pixels is compressed considerably, which results in a shorter device lifetime, a lower display brightness, and the like. Moreover, gaps between pixels of a high-resolution display device are narrow, which does not facilitate the application of a printing process and often leads to undesirable color mixing.

SUMMARY

According to some embodiments of the present disclosure, an organic light emitting diode display panel is provided, comprising: a first substrate; a second substrate opposite to the first substrate; at least one first light emitting layer on a side of the first substrate facing the second substrate; at least one second light emitting layer on the side of the first substrate facing the second substrate, the at least one second light emitting layer being separated from the at least one first light emitting layer; and at least two third light emitting layers on a side of the second substrate facing the first substrate. The at least one first light emitting layer and the at least one second light emitting layer are aligned with corresponding ones of the at least two third light emitting layers.

In some embodiments, the display panel further comprises: a first thin film transistor layer on the side of the first substrate facing the second substrate; a first pixel defining layer, comprising a patterned first barrier at least partially on the first thin film transistor layer and a plurality of first through holes separated by the first barrier; a first transparent electrode layer, comprising a plurality of separate transparent electrodes, the plurality of separate transparent electrodes being in corresponding ones of the plurality of first through holes, the at least one first light emitting layer and the at least one second light emitting layer being in corresponding ones of the plurality of first through holes and on corresponding ones of the plurality of separate transparent electrodes; and a second transparent electrode layer, covering at least the at least one first light emitting layer and the at least one second light emitting layer.

In some embodiments, the plurality of first through holes are separated from each other by the first barrier such that the at least one first light emitting layer and the at least one second light emitting layer are formed by a printing process.

In some embodiments, the display panel further comprises: a second thin film transistor layer on the side of the second substrate facing the first substrate; a reflective electrode layer, comprising a plurality of patterned reflective electrodes on the second thin film transistor layer; a second pixel defining layer, comprising a second barrier partially on the second thin film transistor layer and a plurality of second through holes separated by the second barrier, the at least two third light emitting layers being in corresponding ones of the plurality of second through holes and on corresponding ones of the plurality of patterned reflective electrodes; and a third transparent electrode layer, covering at least the at least two third light emitting layers.

In some embodiments, the at least two third light emitting layers comprise an organic light emitting material suitable for a thermal evaporation process.

In some embodiments, the reflective electrode layer comprises a configuration selected from the group consisting of: an alloy material, a metal-containing composite material, a metal-containing multilayer film structure and a Bragg reflector.

In some embodiments, each of the plurality of first through holes comprises a first aperture, and each of the plurality of second through holes comprises a second aperture smaller than the first aperture, and orthogonal projections of the plurality of patterned reflective electrodes on the first substrate completely cover corresponding ones of the plurality of first through holes.

In some embodiments, the display panel further comprises: a plurality of light-shielding spacers between the first substrate and the second substrate. The plurality of light-shielding spacers are distributed across the display panel and between the first barrier and the second barrier.

In some embodiments, the display panel further comprises: a transparent organic material between the second transparent electrode layer and the third transparent electrode layer.

In some embodiments, the display panel further comprises: two first bonding regions on the side of the first substrate facing the second substrate, the two first bonding regions extending respectively along two abutting edges of the four edges of the display panel; and two second bonding regions on the side of the second substrate facing the first substrate, the two second bonding regions extending respectively along the other two abutting edges of the four edges of the display panel.

In some embodiments, the at least one first light emitting layer is configured to emit red light, the at least one second light emitting layer is configured to emit green light, and the at least two third light emitting layers are configured to emit blue light.

According to some embodiments of the present disclosure, an organic light emitting diode display device comprising any of the above display panels is provided.

According to some embodiments of the present disclosure, a method for manufacturing an organic light emitting diode display panel is provided. The method comprises: providing a first substrate; providing a second substrate opposite to the first substrate; forming at least one first light emitting layer on a side of the first substrate facing the second substrate; forming at least one second light emitting layer on the side of the first substrate facing the second substrate, the at least one second light emitting layer being separated from the at least one first light emitting layer; and forming at least two third light emitting layers on a side of the second substrate facing the first substrate. The at least one first light emitting layer and the at least one second light emitting layer are aligned with corresponding ones of the at least two third light emitting layers.

In some embodiments, forming at least one first light emitting layer and forming at least one second light emitting layer comprise: forming the first light emitting layer and the second light emitting layer by a printing process.

In some embodiments, forming at least two third light emitting layers comprises: forming the third light emitting layers by a thermal evaporation process.

BRIEF DESCRIPTION OF DRAWINGS

Other features, objectives and advantages of the present application will become more obvious by reading the detailed description of non-restrictive embodiments made with reference to the drawings.

DETAILED DESCRIPTION OF EMBODIMENTS

Figure 1:
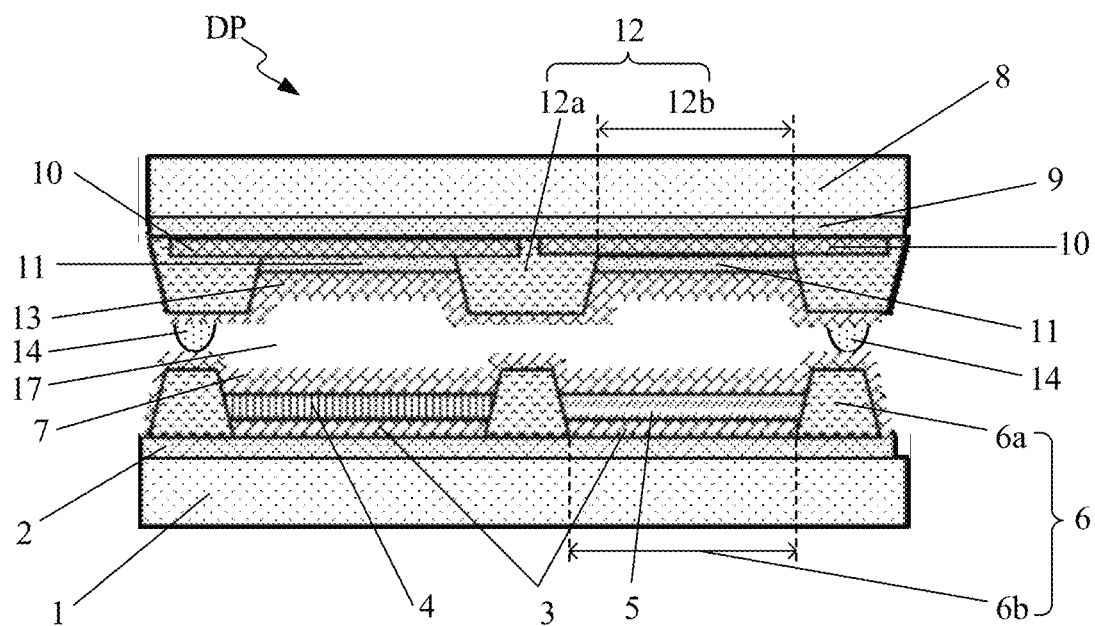
FIG. 1 is a schematic cross-sectional view of an OLED display panel according to an embodiment of this disclosure.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatially relative terms, such as "row direction", "column direction", "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein may be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "directly adjacent to" another element or layer, there are no intervening elements or layers. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The embodiments of this disclosure will be explained in detail with reference to the drawings.

FIG. 1 is a schematic cross-sectional view of an OLED display panel DP according to an embodiment of this disclosure.

Please referring to FIG. 1, the display panel DP comprises a first substrate 1, a second substrate 8 opposite to the first substrate 1, at least one first light emitting layer 4 and at least one second light emitting layer 5 located on a side of the first substrate 1 facing the second substrate 8, and at least two third light emitting layers 11 located on a side of the second substrate 8 facing the first substrate 1.

The at least one first light emitting layer 4 and the at least one second light emitting layer 5 are separated from each other. The at least one first light emitting layer 4 and the at least one second light emitting layer 5 are aligned with corresponding ones of the at least two third light emitting layers 11. In the context, the expression of "the first light emitting layer 4/the second light emitting layer 5 is aligned with the third light emitting layer 11" can mean that an orthogonal projection of the third light emitting layer 11 on the first substrate 1 at least partially overlaps the first light emitting layer 4/the second light emitting layer 5. In some embodiments, a geometric center of the orthogonal projection of the third light emitting layer 11 on the first substrate 1 can overlap a geometric center of the first light emitting layer 4/the second light emitting layer 5.

The first, second and third light emitting layers 4, 5 and 11 are configured to emit light of different colors upon excitation. In some embodiments, the at least one first light emitting layer 4 is configured to emit red light, the at least one second light emitting layer 5 is configured to emit green light, and the at least two third light emitting layers 11 are configured to emit blue light. Other embodiments are also possible.

Corresponding light emitting diodes are formed by the light emitting layers and respective anodes and cathodes, to serve as light emitting devices of corresponding sub-pixels. By arranging the first and second light emitting layers and the third light emitting layers on two different substrates, the space between adjacent light emitting layers is enlarged in case of a same resolution of the sub-pixels. This is helpful for the improvement of the aperture ratio of pixels and the application of the printing process in the manufacture of the display panel. Besides, the risk of color mixing can be reduced.

It will be understood that only one local region of the display panel DP is shown in FIG. 1, and the display panel DP can comprise more sub-pixels than those shown.

Continue to refer to FIG. 1, the display panel DP further comprises a first thin film transistor layer 2, a first pixel defining layer 6, a first transparent electrode layer 3 and a second transparent electrode layer 7 located on the first substrate 1.

The first thin film transistor (TFT) layer 2 is located on the side of the first substrate 1 facing the second substrate 8. Although not shown, the first TFT layer 2 is provided with corresponding pixel circuits connected to each light emitting diode for driving the light emitting diodes to emit light. In order to avoid obscuring the subject matter of this disclosure, the description of the pixel circuits is omitted herein.

The first pixel defining layer 6 comprises a patterned first barrier 6a at least partially on the first thin film transistor layer 2 and a plurality of first through holes 6b separated by the first barrier 6a. The first pixel defining layer 6 can be formed of an inorganic insulating material (e.g., silicon oxides or silicon nitrides) or an organic insulating material (e.g., benzocyclobutene or acrylic resin). It will be understood that the configuration of the first pixel defining layer 6 as shown in FIG. 1 is schematic and exemplary. In other embodiments, the first barrier 6a may have other cross-section shapes, so as to cover a peripheral portion of each transparent electrode 3 for example in addition to a portion of the first TFT layer 2.

The first transparent electrode layer 3 comprises a plurality of separate transparent electrodes, and the plurality of separate transparent electrodes are located within corresponding ones of the plurality of first through holes 6b. The at least one first light emitting layer 4 and the at least one second light emitting layer 5 are located within corresponding ones of the plurality of first through holes 6b and on corresponding ones of the plurality of separate transparent electrodes 3. These transparent electrodes can be used as anodes of the light emitting diodes and be made of indium tin oxide (ITO) for example.

The second transparent electrode layer 7 at least covers the at least one first light emitting layer 4 and the at least one second light emitting layer 5. In the example of FIG. 1, the second transparent electrode layer 7 is shown as a complete layer covering the first light emitting layer 4, the second light emitting layer 5 and the first barrier 6a. Other embodiments are also possible. For example, the second transparent electrode layer 7 can be discontinuous at a step. The second transparent electrode layer 7 can be used as a common cathode of the light emitting diodes and made of metals such as aluminum.

In this embodiment, the plurality of first through holes 6b are separated from each other by the first barrier 6a such that the at least one first light emitting layer 4 and the at least one second light emitting layer 5 can be formed by a printing process. As compared with a thermal evaporation process, the printing process usually requires a greater process margin between the sub-pixels. By arranging the first and second light emitting layers 4 and 5 and the third light emitting layer 11 separately on two different substrates, the process margin can be easily satisfied. For example, a manufacturing accuracy of 300 ppi otherwise can now be reduced to 200 ppi, thereby allowing the application of a printing process. As for the third light emitting layers 11, they can be formed by a printing process or a thermal evaporation process.

Continue to refer to FIG. 1, the display panel DP further comprises a second thin film transistor layer 9, a reflective electrode layer 10, a second pixel defining layer 12, and a third transparent electrode layer 13 located on the second substrate 8.

The second thin film transistor layer 9 is located on the side of the second substrate 8 facing the first substrate 1. Although not shown, the second TFT layer 9 is provided with corresponding pixel circuits connected to each light emitting diode for driving the light emitting diodes to emit light. In order to avoid obscuring the subject matter of this disclosure, the description of the pixel circuits is omitted herein.

The reflective electrode layer 10 is located on the second thin film transistor layer 9. The reflective electrode layer 10 comprises a plurality of patterned reflective electrodes. The reflective electrodes 10 can be used as anodes of the light emitting diodes and be reflective in an extent that most of the light emitted from the first, second, and third light emitting layers 4, 5, and 11 can be reflected. Exemplarily but not restrictively, the reflective electrode layer 10 comprises an alloy material, a metal-containing composite material, a metal-containing multilayer film structure or a Bragg reflector. In some embodiments, the reflective electrode layer 10 can be made of a reflective metal with a thickness of greater than 20 nm.

The second pixel defining layer 12 comprises a second barrier 12a partially located on the second thin film transistor layer 9 and a plurality of second through holes 12b separated by the second barrier 12a. In this embodiment, the second barrier 12a is located at a boundary between the reflective electrodes 10 and partially covers a peripheral portion of each reflective electrode 10. The corresponding portions of the plurality of reflective electrodes 10 are exposed by corresponding ones of the plurality of second through holes 12b. The at least two third light emitting layers 11 are located within corresponding ones of the plurality of second through holes 12b and on corresponding ones of the plurality of reflective electrodes 10. The second pixel defining layer 12 can be formed of an inorganic insulating material (e.g., silicon oxides or silicon nitrides) or an organic insulating material (e.g., benzocyclobutene or acrylic resin).

The third transparent electrode layer 13 covers at least the at least two third light emitting layers 11. In the example of FIG. 1, the third transparent electrode layer 13 is shown as a complete layer covering the third light emitting layer 11 and the second barrier 12a. Other embodiments are also possible. For example, the third transparent electrode layer 13 can be discontinuous at a step. The third transparent electrode layer 13 can be used as a common cathode of the light emitting diodes and made of metals such as aluminum.

In this embodiment, each of the first through holes 6b has a first aperture, and each of the second through holes 12b has a second aperture smaller than the first aperture. Therefore, a light emitting area of a single third light emitting layer 11 is smaller than that of the first light emitting layer 4 or the second light emitting layer 5.

Figure 2:
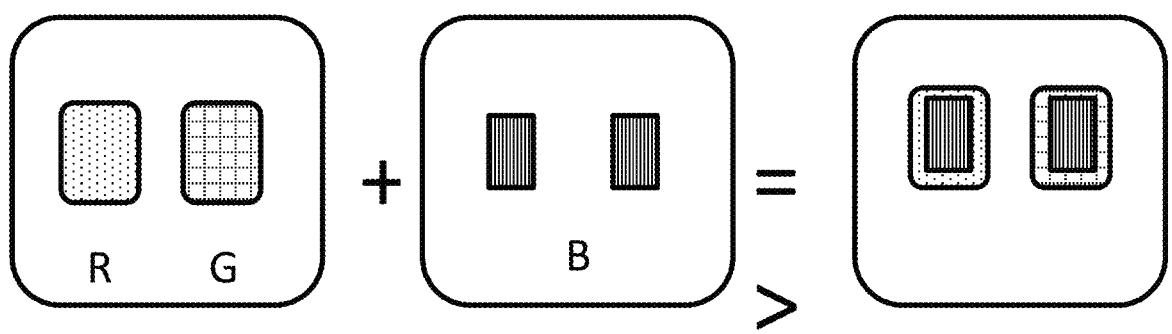
FIG. 2 is a schematic top view of a pixel region in the OLED display panel of FIG. 1.

FIG. 2 is a schematic top view of a pixel region in the display panel DP of FIG. 1.

The pixel region comprises: a first sub-pixel comprising a first light emitting layer 4; a second sub-pixel comprising a second light emitting layer 5; and a third sub-pixel comprising two third light emitting layers 11.

In this embodiment, the first light emitting layer 4 is a red light emitting layer ("R"), the second light emitting layer 5 is a green light emitting layer ("G") and the third light emitting layer 11 is a blue light emitting layer ("B"). As shown in FIG. 2, the red light emitting layer R and the green light emitting layer G are aligned with corresponding ones of the two blue light emitting layers B. In this example, when viewed from above, geometric centers of the two blue light emitting layers B overlap those of the red light emitting layer R and the green light emitting layer G, respectively.

Returning to FIG. 1, orthogonal projections of the plurality of reflective electrodes 10 on the first substrate 1 completely cover corresponding ones of the plurality of first through holes 6b. This provides a sufficiently large reflective surface so that most of the light emitted from the first light emitting layer 4 and the second light emitting layer 5 toward the second substrate 8 is reflected back by the reflective electrode layer 10. Moreover, most of the light emitted from the third light emitting layers 11 toward the second substrate 8 is also reflected back by the reflective electrode layer 10. Due to the transparent properties of the first, second and third transparent electrode layers 3, 7 and 13, the light emitted from the first, second and third light emitting layers 4, 5 and 11 will exit the display panel DP from a lower surface of the first substrate 1, and thus a normal display function is achieved.

In this embodiment, although the two reflective electrodes 10 electrically connected to the two third light emitting layers 11 in this pixel region are shown as being separated from each other, this is not restrictive. In some embodiments, the two reflective electrodes 10 in each pixel region can be formed as an integral structure.

The display panel DP may further comprise a plurality of light-shielding spacers 14 located between the first substrate 1 and the second substrate 8. Specifically, the plurality of light-shielding spacers 14 are distributed across the display panel DP and disposed between the first barrier 6a and the second barrier 12a. On one hand, the plurality of light-shielding spacers 14 are used for separating and supporting the first substrate 1 and the second substrate 8, and on the other hand, they are used for isolating light of each pixel region to further avoid color mixing between different pixel regions. In some embodiments, a light-shielding spacer 14 can be provided every tens or hundreds of pixel regions.

The display panel DP may further comprise a transparent organic material 17 between the second transparent electrode layer 7 and the third transparent electrode layer 13. The transparent organic material 17 is filled between the second transparent electrode layer 7 and the third transparent electrode layer 13, which is helpful for mixing the light emitted from the first, second and third light emitting layers 4, 5 and 11 uniformly within a same pixel region, thereby improving the quality of color rendered by the pixel.

In some embodiments, a distance between the second transparent electrode layer 7 and the third transparent electrode layer 13 is 1-10 μm. The distance is the-smaller-the-better. The distance of 1-10 μm helps to avoid problems such as color mixing or light leakage between different pixel regions.

Figure 3:
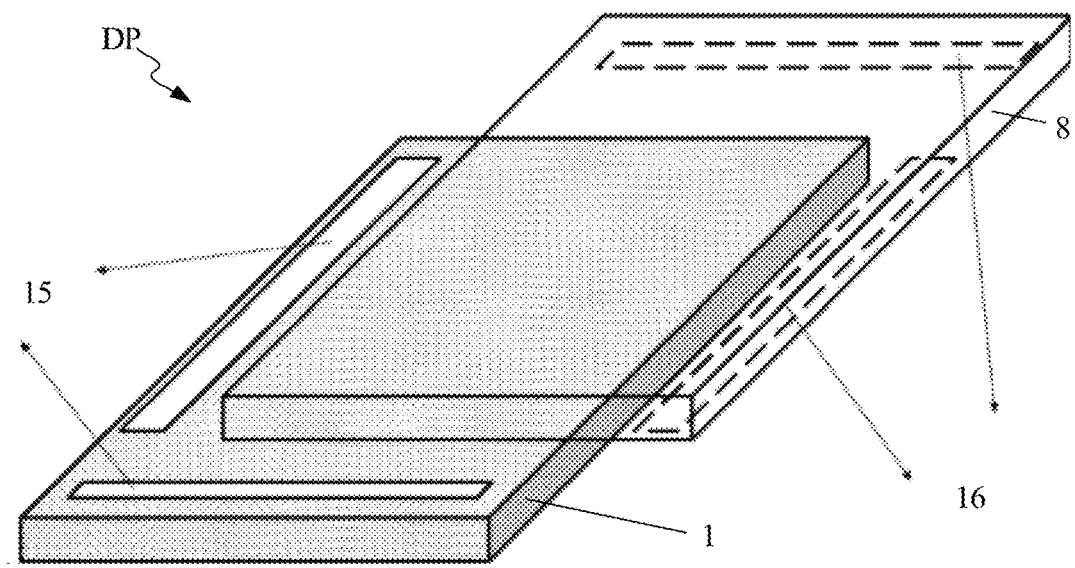
FIG. 3 is a schematic view of a bonding region in the OLED display panel of FIG. 1.

FIG. 3 is a schematic view of a bonding region in the display panel DP of FIG. 1.

Referring to FIG. 3, the display panel DP further comprises two first bonding regions 15 and two second bonding regions 16. The bonding regions 15 and 16 can be provided with a plurality of electrical contacts (not shown) such as pads, via which the pixel circuits in the display panel DP can be electrically connected to an external circuit such as a data driver so as to receive data signals and control signals.

The two first bonding regions 15 are located on the side of the first substrate 1 facing the second substrate 8. The two first bonding regions 15 extend respectively along two abutting edges (the left edge and the bottom edge in FIG. 3) of the four edges of the display panel DP.

The two second bonding regions 16 are located on the side of the second substrate 8 facing the first substrate 1. The two second bonding regions 16 extend respectively along the other two abutting edges (the right edge and the top edge in FIG. 3) of the four edges of the display panel DP.

Figure 4:
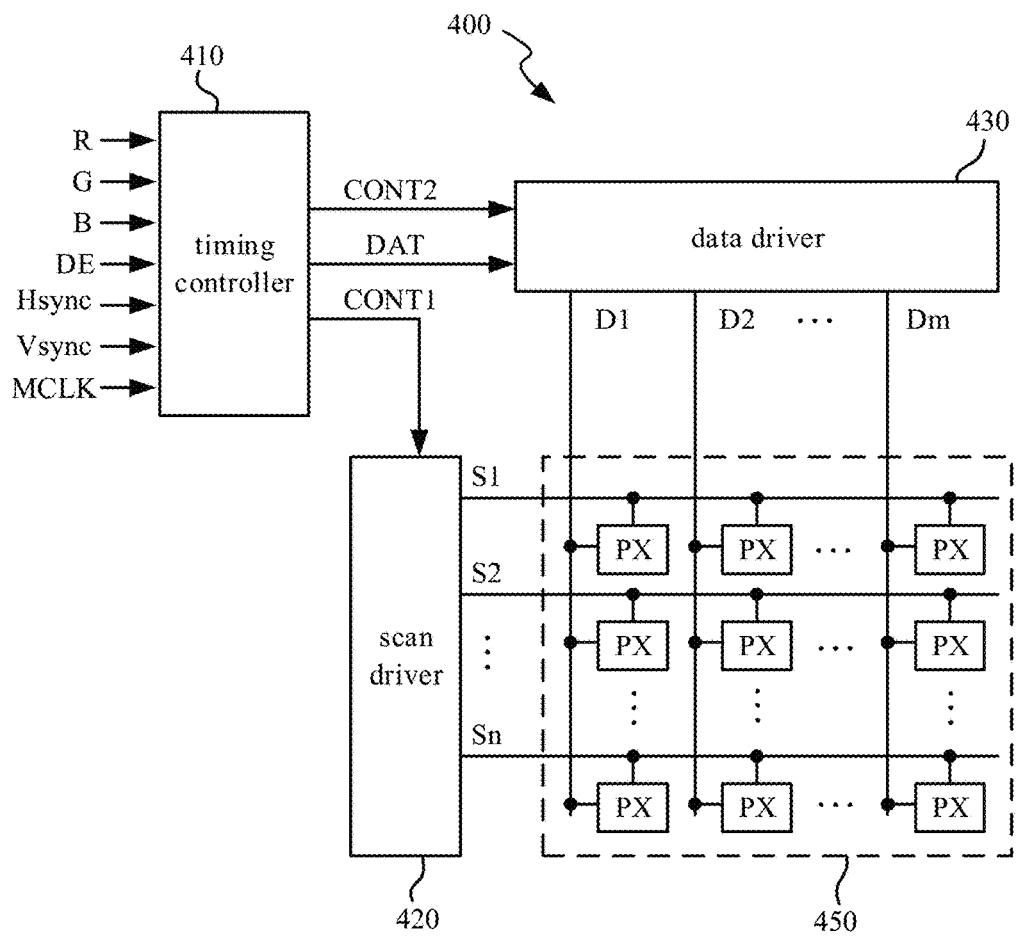
FIG. 4 is a schematic block diagram of an OLED display device according to an embodiment of this disclosure.

FIG. 4 is a schematic block diagram of the OLED display device 400 according to an embodiment of this disclosure.

Referring to FIG. 4, the display device 400 comprises a timing controller 410, a scan driver 420, a data driver 430 and a display panel 450.

The timing controller 410 receives synchronization signals and video signals R, G, and B from a system interface. The synchronization signals comprise a horizontal synchronization signal Hsync, a vertical synchronization signal Vsync, a main clock signal MCLK, and a data enable signal DE. The video signals R, G and B comprise brightness information of each of multiple pixels PX. The timing controller 410 generates a first driving control signal CONT1, a second driving control signal CONT2 and an image data signal DAT based on the video signals R, G and B, the horizontal synchronization signal Hsync, the vertical synchronization signal Vsync, the data enable signal DE and the main clock signal MCLK. The first driving control signal CONT1 comprises a frame start signal FLM, a first clock signal SCLK1 and a second clock signal SCLK2. The frame start signal FLM can be a signal for generating a first scan signal S[1] for displaying a single frame image. The first clock signal SCLK1 and the second clock signal SCLK2 are synchronization signals for generating scan signals S[1]-S[n] sequentially and applying them to corresponding scan lines S1-Sn. The timing controller 410 divides the video signals R, G and B into units of frame based on the vertical synchronization signal Vsync, and divides the video signals R, G and B into units of data line based on the horizontal synchronization signal Hsync, so as to generate the image data signal DAT. The timing controller 410 transmits the image data signal DAT and the second driving control signal CONT2 to the data driver 430.

The display panel 450 comprises the multiple pixels PX arranged substantially in the form of a matrix. In the display panel 450, a plurality of substantially parallel scan lines S1-Sn extend in a row direction, and a plurality of substantially parallel data lines D1-Dm extend in a column direction. The scan lines S1-Sn and the data lines D1-Dm are coupled to the pixels PX. The display panel 450 can take the form of any of the display panels DP described above in FIGS. 1-3 and the variations thereof.

The scan driver 420 is coupled to the scan lines S1-Sn, and generates a corresponding plurality of scan signals S[1]-S[n] based on the first driving control signal CONT1. The scan driver 420 can apply the scan signals S[1]-S[n] to the scan lines S1-Sn sequentially.

The data driver 430 is coupled to the data lines D1-Dm, and samples and holds the image data signal DAT based on the second driving control signal CONT2, and applies multiple data signals D[1]-D[m] to the data lines D1-Dm, respectively. By applying the data signals D[1]-D[m] having a setting voltage range (e.g., a predetermined voltage range) to the data lines D1-Dm based on the scan signals S[1]-S[n] of gate-on voltages applied to the scan lines S1-Sn respectively, the data driver 430 can program the data into the pixels PX.

Exemplarily but not restrictively, the display device 400 can be any product or component having a display function such as a cell phone, a tablet computer, a television, a display, a notebook computer, a digital photo frame or a navigator. The display device 400 has the same advantages as the display panel embodiments described above, which will not be repeated herein for simplicity.

Figure 5:
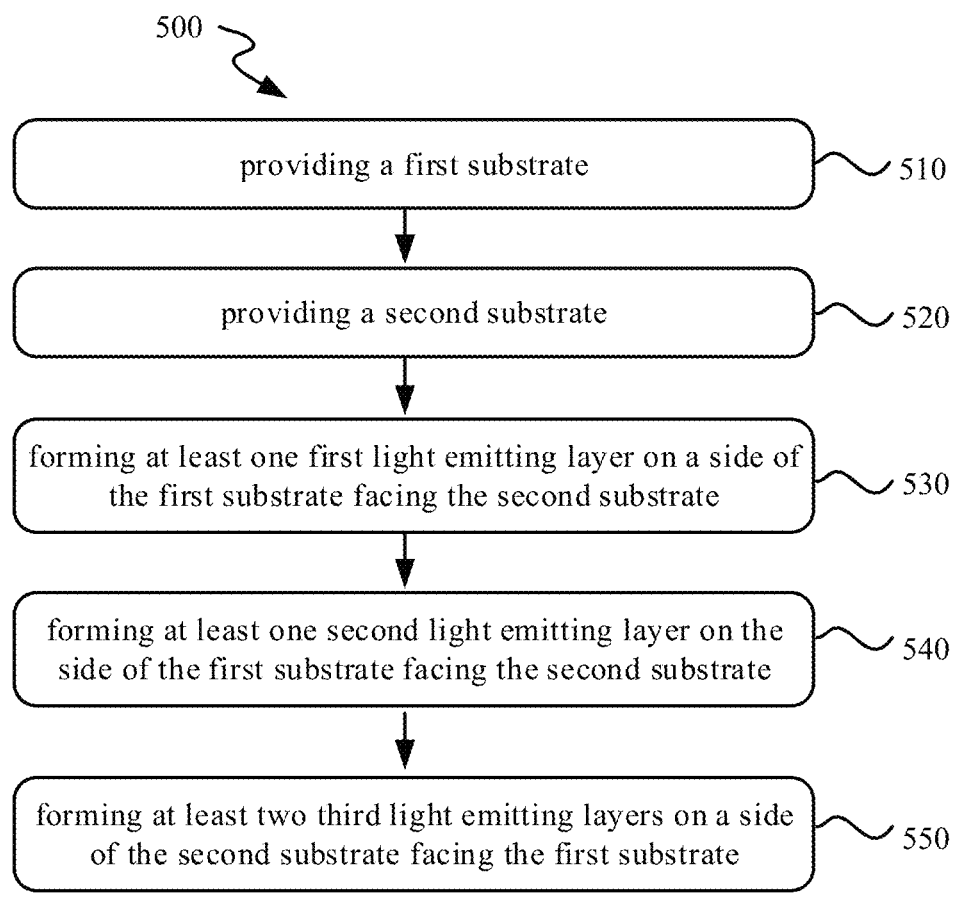
FIG. 5 is a flow chart of a method for manufacturing an OLED display panel according to an embodiment of this disclosure.

FIG. 5 is a flow chart of a method 500 for manufacturing an OLED display panel according to an embodiment of this disclosure. The method 500 can be used for manufacturing the display panel DP described above, and will be described with reference to FIG. 1 and FIG. 5.

In step 510, a first substrate 1 is provided. The first substrate 1 can be made of a transparent material such as glass or resin.

In step 520, a second substrate 8 is provided. The second substrate 8 is opposite to the first substrate 1.

In step 530, at least one first light emitting layer 4 is formed on a side of the first substrate 1 facing the second substrate 8. The first light emitting layer 4 may comprise for example an organic light emitting material configured to emit red light upon excitation.

In step 540, at least one second light emitting layer 5 is formed on the side of the first substrate 1 facing the second substrate 8. The at least one second light emitting layer 5 and the at least one first light emitting layer 4 are separated from each other. The second light emitting layer 5 may comprise for example an organic light emitting material configured to emit green light upon excitation.

In step 550, at least two third light emitting layers 11 are formed on a side of the second substrate 8 facing the first substrate 1. The at least two third light emitting layers 11 are formed such that the at least one first light emitting layer 4 and the at least one second light emitting layer 5 are aligned with corresponding ones of the at least two third light emitting layers 11. The third light emitting layer 11 may comprise for example an organic light emitting material configured to emit blue light upon excitation.

In steps 530 and 540, the first light emitting layer 4 and the second light emitting layer 5 may be formed by a printing process, although this is not necessary. In some embodiments, the first light emitting layer 4 may also be formed by a thermal evaporation process. In step 550, the third light emitting layers 11 may be formed by a printing process or a thermal evaporation process. In case of a blue light emitting layer, the thermal evaporation process can be advantageous because the blue organic light emitting material has a poor performance in the printing process.

The method 500 has the same advantages as the display panel embodiments described above, which will not be repeated herein for simplicity. Although the operations are depicted as being executed in a specific sequence as shown in FIG. 5, this should not be construed as requiring the operations to be executed in the shown specific sequence or sequentially, or requiring all shown operations to be executed in order to obtain the desired result.

Variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. An organic light emitting diode display panel, comprising:
   a first substrate;
   a second substrate opposite to the first substrate;
   at least one first light emitting layer on a side of the first substrate facing the second substrate;
   at least one second light emitting layer on the side of the first substrate facing the second substrate, wherein the at least one second light emitting layer is separated from the at least one first light emitting layer;
   at least two third light emitting layers on a side of the second substrate facing the first substrate;
   a first pixel defining layer comprising a patterned first barrier and a plurality of first through holes separated by the patterned first barrier, wherein the at least one first light emitting layer and the at least one second light emitting layer are in corresponding ones of the plurality of first through holes; and
   a second pixel defining layer comprising a second barrier and a plurality of second through holes separated by the second barrier, wherein the at least two third light emitting layers are in corresponding ones of the plurality of second through holes,
   wherein the at least one first light emitting layer and the at least one second light emitting layer are aligned with corresponding ones of the at least two third light emitting layers, and
   wherein each of the plurality of first through holes comprises a first aperture, and each of the plurality of second through holes comprises a second aperture smaller than the first aperture.

2. The display panel according to claim 1, further comprising:
   a first thin film transistor layer on the side of the first substrate facing the second substrate, wherein the patterned first barrier of the first pixel defining layer is at least partially on the first thin film transistor layer;
   a first transparent electrode layer, comprising a plurality of separate transparent electrodes, wherein the plurality of separate transparent electrodes are in corresponding ones of the plurality of first through holes, wherein the at least one first light emitting layer and the at least one second light emitting layer are on corresponding ones of the plurality of separate transparent electrodes; and a second transparent electrode layer, covering at least the at least one first light emitting layer and the at least one second light emitting layer.

3. The display panel according to claim 2, wherein the plurality of first through holes are separated from each other by the patterned first barrier such that the at least one first light emitting layer and the at least one second light emitting layer are formed by a printing process.

4. The display panel according to claim 3, further comprising:
   a second thin film transistor layer on the side of the second substrate facing the first substrate, wherein the second barrier of the second pixel defining layer is partially on the second thin film transistor layer;
   a reflective electrode layer, comprising a plurality of patterned reflective electrodes on the second thin film transistor layer, wherein the at least two third light emitting layers are on corresponding ones of the plurality of patterned reflective electrodes; and;
   a third transparent electrode layer, covering at least the at least two third light emitting layers.

5. The display panel according to claim 2, further comprising:
   a second thin film transistor layer on the side of the second substrate facing the first substrate, wherein the second barrier of the second pixel defining layer is partially on the second thin film transistor layer;
   a reflective electrode layer, comprising a plurality of patterned reflective electrodes on the second thin film transistor layer, wherein the at least two third light emitting layers are on corresponding ones of the plurality of patterned reflective electrodes; and
   a third transparent electrode layer, covering at least the at least two third light emitting layers.

6. The display panel according to claim 5, wherein the at least two third light emitting layers comprise an organic light emitting material suitable for a thermal evaporation process.

7. The display panel according to claim 5, wherein the reflective electrode layer comprises a configuration selected from the group consisting of: an alloy material, a metal-containing composite material, a metal-containing multi-layer film structure and a Bragg reflector.

8. The display panel according to claim 5,
   wherein orthogonal projections of the plurality of patterned reflective electrodes on the first substrate completely cover the corresponding ones of the plurality of first through holes.

9. The display panel according to claim 5, further comprising:
   a plurality of light-shielding spacers between the first substrate and the second substrate,
   wherein the plurality of light-shielding spacers are distributed across the display panel and between the patterned first barrier and the second barrier.

10. The display panel according to claim 5, further comprising: a transparent organic material between the second transparent electrode layer and the third transparent electrode layer.

11. The display panel according to claim 1, further comprising:
   two first bonding regions on the side of the first substrate facing the second substrate, wherein the two first bonding regions extend respectively along two abutting edges of four edges of the display panel; and
   two second bonding regions on the side of the second substrate facing the first substrate, wherein the two second bonding regions extend respectively along two abutting edges of four edges of the display panel.

12. The display panel according to claim 1,
   wherein the at least one first light emitting layer is configured to emit red light,
   wherein the at least one second light emitting layer is configured to emit green light, and
   wherein the at least two third light emitting layers are configured to emit blue light.

13. An organic light emitting diode display device, comprising the display panel according to claim 1.

14. The organic light emitting diode display device according to claim 13, further comprising:
   a first thin film transistor layer on the side of the first substrate facing the second substrate, wherein the patterned first barrier of the first pixel defining layer is at least partially on the first thin film transistor layer;
   a first transparent electrode layer, comprising a plurality of separate transparent electrodes, wherein the plurality of separate transparent electrodes are in corresponding ones of the plurality of first through holes, wherein the at least one first light emitting layer and the at least one second light emitting layer are on corresponding ones of the plurality of separate transparent electrodes; and
   a second transparent electrode layer, covering at least the at least one first light emitting layer and the at least one second light emitting layer.

15. The organic light emitting diode display device according to claim 14, further comprising:
   a second thin film transistor layer on the side of the second substrate facing the first substrate, wherein the second barrier of the second pixel defining layer is partially on the second thin film transistor layer;
   a reflective electrode layer, comprising a plurality of patterned reflective electrodes on the second thin film transistor layer, wherein the at least two third light emitting layers are on corresponding ones of the plurality of patterned reflective electrodes; and;
   a third transparent electrode layer, covering at least the at least two third light emitting layers.

16. The organic light emitting diode display device according to claim 15, further comprising:
   a plurality of light-shielding spacers between the first substrate and the second substrate, wherein the plurality of light-shielding spacers are distributed across the display panel and between the patterned first barrier and the second barrier.

17. The display panel according to claim 1, further comprising:
   a second thin film transistor layer on the side of the second substrate facing the first substrate, wherein the second barrier of the second pixel defining layer is partially on the second thin film transistor layer;
   a reflective electrode layer, comprising a plurality of patterned reflective electrodes on the second thin film transistor layer, wherein the at least two third light emitting layers are on corresponding ones of the plurality of patterned reflective electrodes; and
   a third transparent electrode layer, covering at least the at least two third light emitting layers.

18. A method for manufacturing an organic light emitting diode display panel, the method comprising:
   providing a first substrate;
   providing a second substrate opposite to the first substrate;
   forming at least one first light emitting layer on a side of the first substrate facing the second substrate;

forming at least one second light emitting layer on the side of the first substrate facing the second substrate, wherein the at least one second light emitting layer is separated from the at least one first light emitting layer;

forming a first pixel defining layer on the side of the first substrate facing the second substrate, the first pixel defining layer comprising a patterned first barrier and a plurality of first through holes separated by the patterned first barrier, wherein the at least one first light emitting layer and the at least one second light emitting layer are in corresponding ones of the plurality of first through holes;

forming at least two third light emitting layers on a side of the second substrate facing the first substrate, and forming a second pixel defining layer on the side of the second substrate facing the first substrate, the second pixel defining layer comprising a second barrier and a plurality of second through holes separated by the second barrier, wherein the at least two third emitting layers are in corresponding ones of the plurality of second through holes, wherein the at least one first light emitting layer and the at least one second light emitting layer are aligned with corresponding ones of the at least two third light emitting layers, and wherein each of the plurality of first through holes comprises a first aperture, and each of the plurality of second through holes comprises a second aperture smaller than the first aperture.

19. The method according to claim 18, wherein forming at least one first light emitting layer and forming at least one second light emitting layer comprise: forming the at least one first light emitting layer and the at least one second light emitting layer by a printing process.

20. The method according to claim 18, wherein forming at least two third light emitting layers comprises: forming the at least two third light emitting layers by a thermal evaporation process.

\* \* \* \* \*